(12) United States Patent
Goto

(10) Patent No.: US 11,625,218 B2
(45) Date of Patent: Apr. 11, 2023

(54) SOUND OUTPUT DEVICE, SOUND OUTPUT SYSTEM, AND OUTPUT SOUND CONTROL METHOD WITH APPROPRIATELY CONTROLLABLE VOLUME, AND RECORDING MEDIUM

(71) Applicant: Tomoyuki Goto, Tokyo (JP)

(72) Inventor: Tomoyuki Goto, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 130 days.

(21) Appl. No.: 17/223,196

(22) Filed: Apr. 6, 2021

(65) Prior Publication Data

US 2021/0311693 A1    Oct. 7, 2021

(30) Foreign Application Priority Data

Apr. 7, 2020 (JP) .............................. JP2020-069315
Mar. 29, 2021 (JP) .............................. JP2021-055569

(51) Int. Cl.
*G06F 3/16* (2006.01)
*H03G 7/00* (2006.01)
*H04R 3/00* (2006.01)

(52) U.S. Cl.
CPC ............. *G06F 3/165* (2013.01); *H03G 7/002* (2013.01); *H04R 3/00* (2013.01); *H04R 2430/01* (2013.01)

(58) Field of Classification Search
CPC .......... G06F 3/165; H03G 7/002; H04R 3/00; H04R 2430/01
See application file for complete search history.

(56) References Cited

U.S. PATENT DOCUMENTS

| | | | |
|---|---|---|---|
| 6,421,042 B1 | 7/2002 | Omura et al. | |
| 6,529,920 B1 | 3/2003 | Arons et al. | |
| 2009/0245538 A1 | 10/2009 | Tomita | |
| 2012/0014538 A1* | 1/2012 | Bozkurt | H03G 3/001 381/107 |
| 2013/0342704 A1* | 12/2013 | Williams | G06F 3/0317 348/838 |
| 2017/0034474 A1 | 2/2017 | Goto et al. | |
| 2017/0127017 A1 | 5/2017 | Takahashi et al. | |
| 2019/0296702 A1* | 9/2019 | Ito | H03G 3/3005 |

FOREIGN PATENT DOCUMENTS

| | | |
|---|---|---|
| JP | 2000-132340 | 5/2000 |
| JP | 2002-244631 | 8/2002 |
| JP | 2015-213291 | 11/2015 |

OTHER PUBLICATIONS

Extended European Search Report for EP21167165.6 dated Sep. 2, 2021.

* cited by examiner

*Primary Examiner* — Joseph Saunders, Jr.
(74) *Attorney, Agent, or Firm* — IPUSA, PLLC

(57) ABSTRACT

A sound output device includes: first circuitry, connected to a first audio device, that outputs sound based on sound output data via the first audio device according to first sound volume data; and second circuitry connected to a second audio device, including an amplifier that amplifies sound to be output from the second audio device according to second sound volume data. The second circuitry controls a value of the second sound volume data to be a fixed value, receives, from the first circuitry, the sound output data and the first sound volume data, and outputs sound based on the sound output data that is received, via the second audio device, according to the first sound volume data that is received.

6 Claims, 9 Drawing Sheets

SOUND OUTPUT DEVICE, SOUND OUTPUT SYSTEM, AND OUTPUT SOUND CONTROL METHOD WITH APPROPRIATELY CONTROLLABLE VOLUME, AND RECORDING MEDIUM

CROSS-REFERENCE TO RELATED APPLICATIONS

This patent application is based on and claims priority pursuant to 35 U.S.C. § 119(a) to Japanese Patent Application Nos. 2020-069315, filed on Apr. 7, 2020, and 2021-055569, filed on Mar. 29, 2021, in the Japan Patent Office, the entire disclosure of which is hereby incorporated by reference herein.

BACKGROUND

Technical Field

The present invention relates to a sound output device, a sound output system, an output sound control method, and a recording medium.

Related Art

In the known configuration in which a speaker is connected to an electronic whiteboard, sound output from the speaker may be controlled by operating a remote controller.

According to the known technique, a host device may be connected to an audio device by Universal Serial Bus (USB). To output sound from the audio device, the value of sound instructed by the host device is compared with a value set at a volume control unit of the audio device to output a comparison result. The volume of sound to be output is synchronized based on the comparison result.

However, when a plurality of audio devices such as speakers or peripheral sound-related devices is connected to a sound output device, each audio device has information on volume of sound to be output. It has been difficult to appropriately control to change the volume of sound to be output from the sound output device. For example, in some cases, it was not possible to appropriately change the volume of sound output through one or more of the audio devices.

SUMMARY

In one exemplary aspect, a sound output device includes: first circuitry, connected to a first audio device, that outputs sound based on sound output data via the first audio device according to first sound volume data; and second circuitry connected to a second audio device, including an amplifier that amplifies sound to be output from the second audio device according to second sound volume data. The second circuitry controls a value of the second sound volume data to be a fixed value. The second circuitry further receives, from the first circuitry, the sound output data and the first sound volume data, and outputs sound based on the sound output data that is received, via the second audio device, according to the first sound volume data that is received.

In another exemplary aspect, a sound output system is provided, which includes the sound output device.

In another exemplary aspect, a method for controlling sound output is performed by a sound output device including first circuitry connected to a first audio device and second circuitry connected to a second audio device. The method includes: determining whether the first circuitry is available; controlling a value of second sound volume data stored for the second circuitry to be a fixed value, based on a determination that the first circuitry is available; transmitting, from the first circuitry to the second circuitry, first sound volume data stored for the first circuitry, and sound output data; and outputting sound based on the sound output data, via the second audio device, according to the first sound volume data.

In another exemplary aspect, a computer program for controlling one or more processors to carry out the above-described method is provided.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
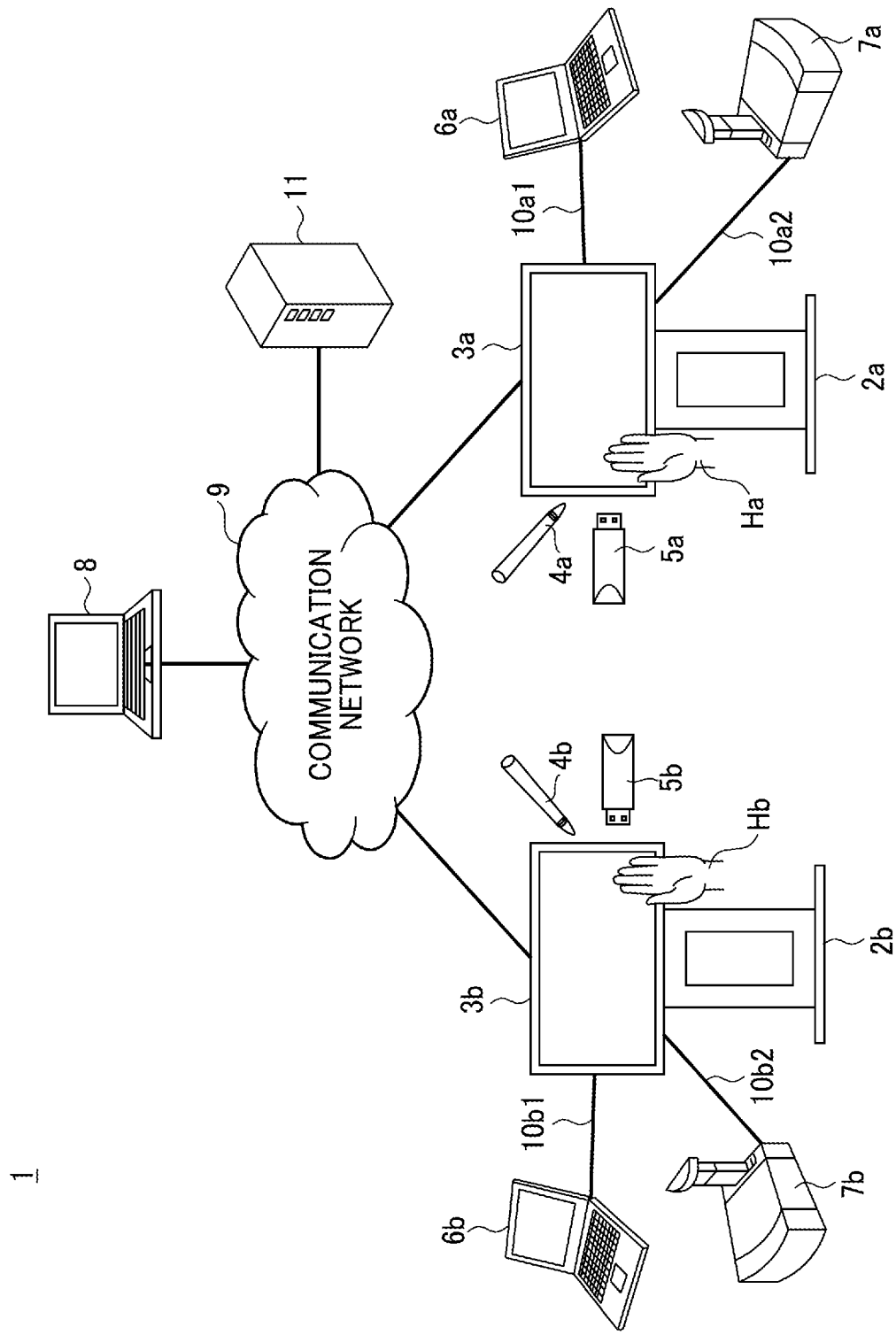
FIG. 1 is a diagram illustrating an example use of an electronic whiteboard, when the electronic whiteboard is provided in an information processing system.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

First Embodiment

In the following, an electronic whiteboard having a sound output device will be described as an example.

FIG. 1 is a diagram illustrating an example application of an electronic whiteboard according to an exemplary embodiment. For simplicity, the following describes an example case in which two electronic whiteboards 2a and 2b, and electronic pens 4a and 4b respectively provided for these electronic whiteboards 2a and 2b are provided. In this embodiment, three or more electronic whiteboards or electronic pens may be used, or one electronic whiteboard may be used.

Referring to FIG. 1, an image processing system 1 includes the electronic whiteboards 2a and 2b, the electronic pens 4a and 4b, universal serial bus (USB) memories 5a and 5b, notebook personal computers (PCs) 6a and 6b, video conference terminals 7a and 7b, and a PC 8. As described below, in this disclosure, the electronic whiteboards 2a and 2b, and the PC8 are each an example of information processing apparatus.

Further, the electronic whiteboards 2a and 2b and the PC 8 are communicably connected via a communication network 9. The electronic whiteboards 2a and 2b are respectively provided with displays 3a and 3b.

The electronic whiteboard 2a displays an image on the display 3a, which is drawn in response to detection of an event by the electronic pen 4a. The event is, for example, an operation such as touching the display 3a with the tip of the electronic pen 4a or the bottom of the electronic pen 4a.

Further, the electronic whiteboard 2a may change the drawing image being displayed on the display 3a, according to an event (for example, the user's gesture indicating size enlargement, size reduction, or turning pages) made by the user's hand Ha, in alternative to the electronic pen 4a.

The electronic whiteboard 2a is connectable with the USB memory 5a. When connected with the USB memory 5a, the electronic whiteboard 2a reads an electronic file such as a Portable Document Format (PDF) from the USB memory 5a, or stores the electronic file in the USB memory 5a.

The electronic whiteboard 2a is provided with a connector compatible with a standard such as DisplayPort, Digital Visual Interface (DVI), High-Definition Multimedia Interface (HDMI: Registered Trademark), and Video Graphics Array (VGA). Through the connector, the electronic whiteboard 2a is connected with the notebook PC 6a via a cable 10a1.

In response to detection of an event such as contact with the display 3a, the electronic whiteboard 2a transmits event information indicating content of the event to the notebook PC 6a. Similarly, the electronic whiteboard 2a is connected to the video conference terminal 7a (sometimes referred to as a "teleconference terminal") via a cable 10a2 communicable based on a standard, such as the above-described standard.

The notebook PC 6a and the video conference terminal 7a may communicate with the electronic whiteboard 2a by wireless communication compatible with a wireless communication protocol such as BLUETOOTH.

On the other hand, at other site where the electronic whiteboard 2b is provided, similarly to the above-described case of the electronic whiteboard 2a, the electronic whiteboard 2b is provided with the display 3b, the electronic pen 4b, the USB memory 5b, the notebook PC 6b, the video conference terminal 7b, the cable 10b1, and the cable 10b2. Further, the electronic whiteboard 2b changes the image displayed on the display 3b according to an event generated by such as the user's hand Hb or the electronic pen 4b.

The server 11 controls communication between different sites through the communication network 9. For example, the server 11 controls a connection established between the electronic whiteboards 2a and 2b through the communication network 9. At least one of the electronic whiteboards 2a and 2b requests for connection to the server 11, to establish a connection between the electronic whiteboards 2a and 2b. Through controlling connections between different apparatuses or sites through the communication network 9, the server 11 is able to control communication between different apparatuses such as the electronic whiteboards 2, or different sites, through the communication network 9.

As described above, the image drawn on the display 3a of the electronic whiteboard 2a at one site is displayed on the display 3b of the electronic whiteboard 2b at another site. On the other hand, the image drawn on the display 3b of the electronic whiteboard 2b at the another site is displayed on the display 3a of the electronic whiteboard 2a at the one site.

In this way, the image processing system 1 enables sharing of the same image between sites that are remotely located. The image processing system 1 is useful when carrying out meetings at remotely located sites.

In the following example, any arbitrary one of the electronic whiteboards 2a and 2b is referred to as the "electronic whiteboard 2".

Similarly, any arbitrary one of the displays 3a and 3b is referred to as the "display 3".

Any arbitrary one of the electronic pens 4a and 4b is referred to as the "electronic pen 4".

Any arbitrary one of the USB memories 5a and 5b is referred to as the "USB memory 5".

Any arbitrary one of the notebook PCs 6a and 6b is referred to as the "notebook PC 6".

Any arbitrary one of the video conference terminals 7a and 7b is referred to as the "video conferencing terminal 7".

Any arbitrary one of the hands Ha and Hb of users is referred to as the "hand H".

Any arbitrary one of the cables 10a1, 10a2, 10$_b$1, and 10b2 is referred to as the "cable 10".

Further, in the following description, an example in which the electronic whiteboard is provided with a sound output device is described. However, an apparatus provided with the sound output device may be any apparatus other than the electronic whiteboard.

For example, the sound output device may be incorporated in an apparatus such as an electronic signage (digital signage), a telestrator used for sports or weather forecasting, or a remote image (video) diagnostic device.

In the following description, an example in which the information processing terminal is a notebook PC 6 will be described. However, the information processing terminal is not limited to this example. For example, the information processing terminal may be a terminal capable of supplying an image frame such as a desktop PC, a tablet PC, a portable digital assistant (PDA), a digital video camera, a digital camera, or a game machine.

The communication network 9 includes the Internet, a Local Area Network LAN (LAN), a mobile phone communication network, for example. In order to enhance security, the communication network 9 may be connected to the Internet using a Virtual Private Network (VPN).

In the following description, an example in which the recording medium is a USB memory is described. However, the recording medium is not limited to this example. For example, the recording medium may be another type of recording medium such as a secure digital (SD: Registered Trademark) memory card.

In this description, an image representing characters, figures, numbers, symbols, lines or a combination thereof that the user writes by hand on the electronic whiteboard is called a "stroke image".

Example Hardware Configuration of Electronic Whiteboard:

Hereinafter, an example hardware configuration of the electronic whiteboard is described according to the present embodiment.

Figure 2:
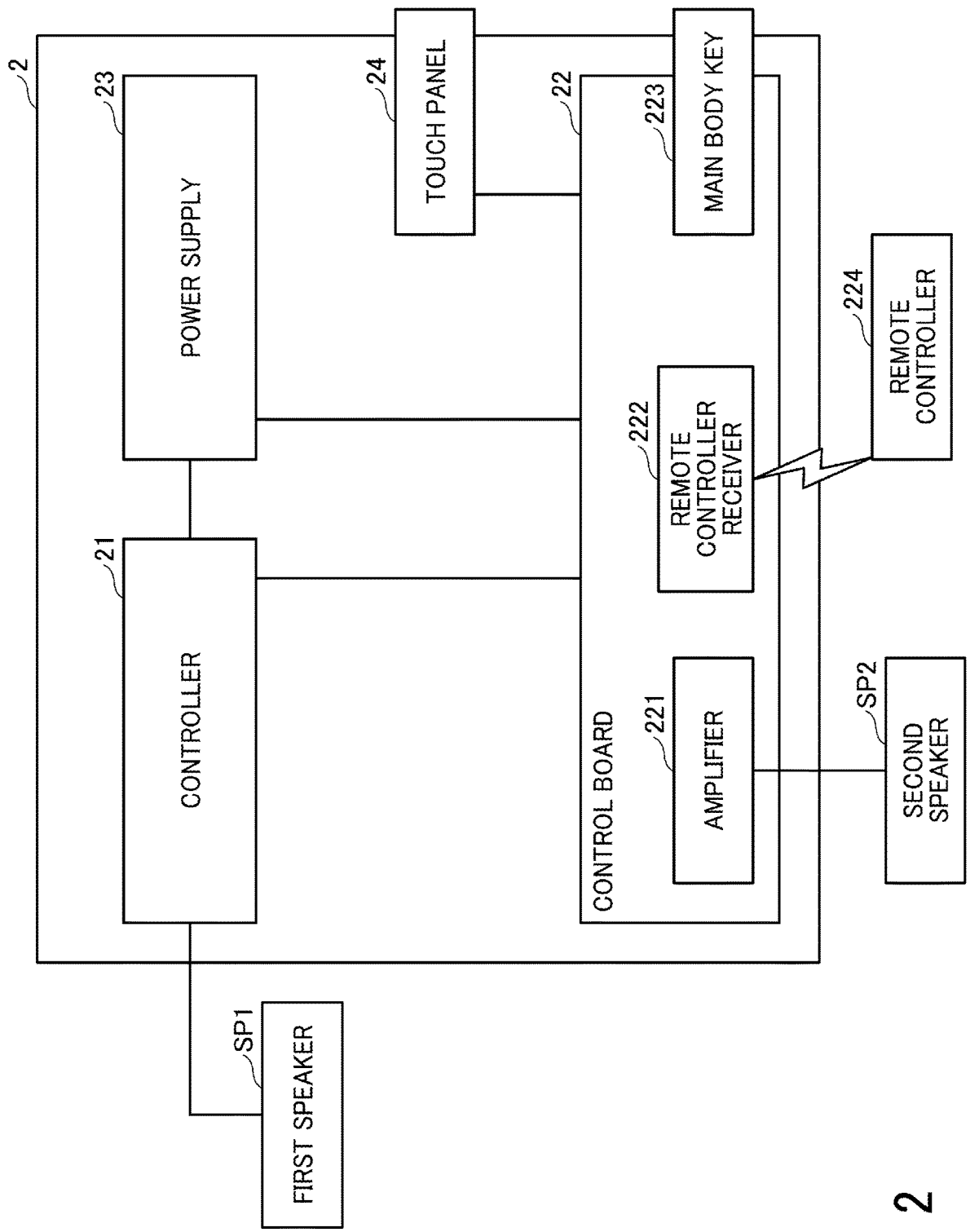
FIG. 2 is a schematic diagram illustrating a hardware configuration of an electronic whiteboard, as an example of sound output device, according to an embodiment.

FIG. 2 is a schematic block diagram illustrating a hardware configuration of the electronic whiteboard, according to the embodiment. The electronic whiteboard 2 includes a controller 21, a control board 22, a power supply 23, and a touch panel 24.

The controller 21 includes a Central Processing Unit (CPU), which is an example of a device that performs control and calculations, and a storage device such as a memory. The controller 21 is connected to a first speaker SP1, which is an example of a first audio device.

The control board 22 includes an amplifier 221, a remote controller receiver 222, and a main body key 223. The control board 22 is connected to a second speaker SP2, which is an example of a second audio device different from the first speaker SP1.

The power supply 23 supplies electric power to at least a part of the electronic whiteboard 2 such as the controller 21 and the control board 22.

The touch panel 24 functions as an output device that displays a processing result to the user and an input device that receives an operation from the user.

The first speaker SP1 is, for example, an external speaker connected in compliance with such as Universal Serial Bus (USB) Audio Class. As illustrated in FIG. 2, the connection destination of the first speaker SP1 is the controller 21. Further, an audio amplifier for the first speaker SP1 is built in, for example, the first speaker SP1.

The second speaker SP2 is a speaker connected to the electronic whiteboard 2 via an audio output terminal of the electronic whiteboard 2. For example, when the second speaker SP2 is connected as a passive speaker, the second speaker SP2 is controlled by the amplifier 221 built in the electronic whiteboard 2. In another example, when the second speaker SP2 is connected as an active speaker, an amplifier is also mounted on the external speaker, that is, the second speaker SP2. Therefore, volume can be adjusted by adjusting the amplifier mounted on the external speaker. For example, when the second speaker SP2 is connected by Line Out, volume has a value that is kept constant. On the other hand, when the second speaker SP2 is connected by Head-Phone Out, the second speaker SP2 is controlled by the amplifier 221 built in the electronic whiteboard 2.

In this disclosure, for example, an operation unit is implemented by a user interface, such as the remote controller receiver 222 and the remote controller 224. The operation unit may additionally or alternatively be implemented by, for example, the main body key 223. The operation unit receives operation by the user.

The remote controller receiver 222 is a device that accepts operation by the user via the remote controller 224.

The main body key 223 is a device that accepts operation by the user pressing a button or the like.

For example, the user performs various operations including changing a volume value by using the remote controller 224 or the main body key 223.

Figure 3:
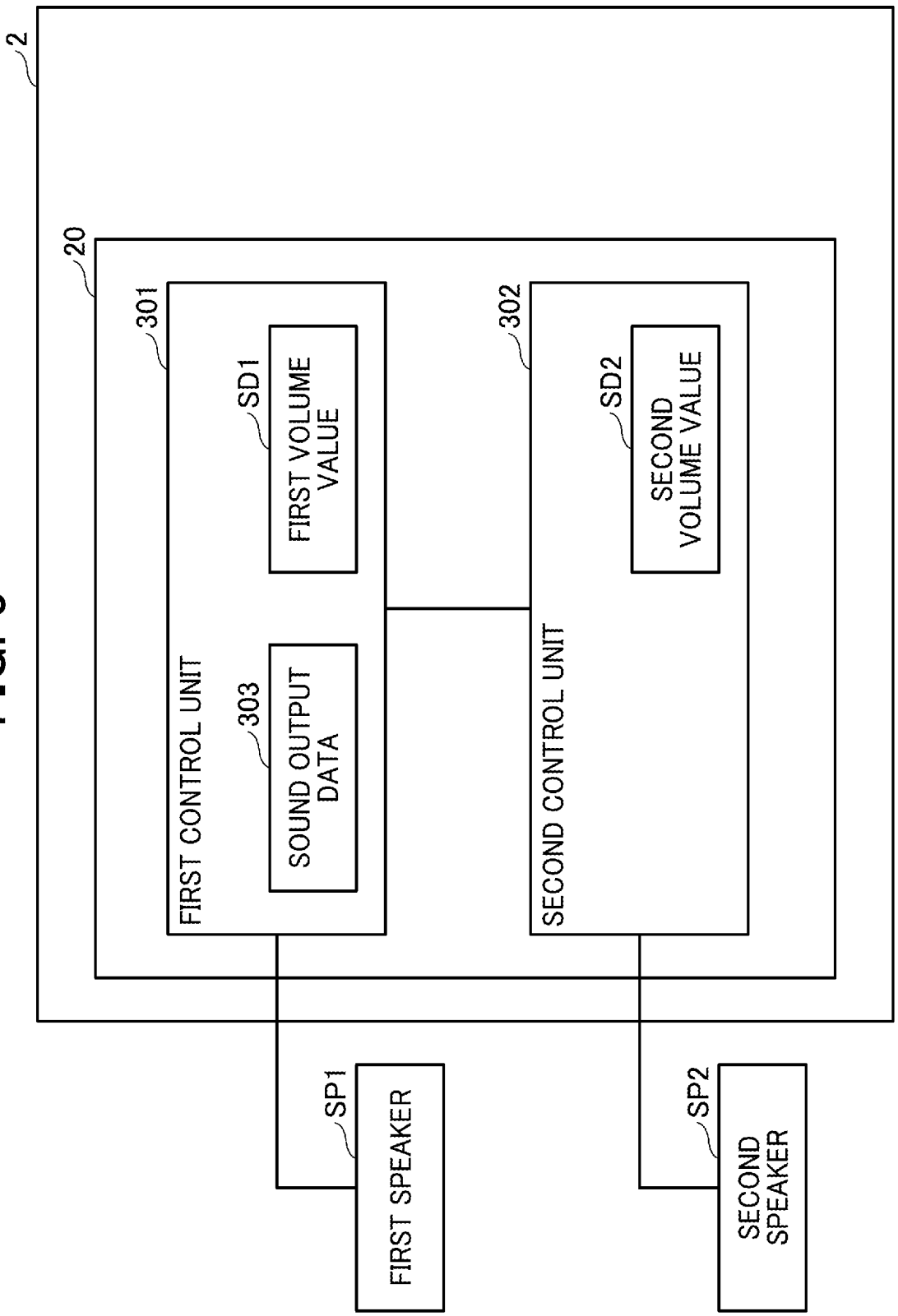
FIG. 3 is a schematic diagram illustrating a functional configuration of the electronic whiteboard of FIG. 2 according to the embodiment.

Example Functional Configuration:

FIG. 3 is a diagram illustrating a functional configuration of the electronic whiteboard 2 illustrated in FIG. 2, according to an embodiment. The electronic whiteboard 2 is provided with a function of the information processing apparatus that processes information, and a function of the sound output device 20 that controls output of sound. The electronic whiteboard 2, which operates as the information processing apparatus and the sound output device 20, is an example of a sound output system. The sound output device 20 includes, as a functional configuration, a first control unit 301 and a second control unit 302.

The first control unit 301 is implemented by, for example, the controller 21. The second control unit 302 is implemented by, for example, the control board 22.

Hereinafter, an example case in which the first control unit 301 controls sound output data 303 is described.

The sound output data 303 is, for example, electronic data used for reproducing sound, which can be stored in a computer system, such as a memory available to the first control unit 301. The sound output data 303 may be data containing only sound data, or data containing video data in addition to sound data. Specifically, in this embodiment, the sound output data 303 may be generated in any one of various file formats including MPEG Audio Layer-3 (MP3), MPEG Audio Layer-4 (MP4), Waveform Audio Format (WAV), and Audio Video Interleave (AVI).

Further, an example of first volume data controlled by the first control unit 301 is referred to as "first volume value SD1", which indicates a volume of sound to be output under control of the first control unit 301. The first volume value SD1 is stored in the memory of the controller 21. An example of second volume data controlled by the second control unit 302 is referred to as "second volume value SD2", which indicates a volume of sound to be output under control of the second control unit 302. The second volume value SD2 is stored in a memory of the control board 22.

As illustrated in FIG. 3, a connection destination is different between the first audio device (first speaker SP1) and the second audio device (second speaker SP2).

The audio devices available to the electronic whiteboard 2 may have, for example, a connection configuration such as a first example connection configuration or a second example connection configuration, as described below.

Figure 4:
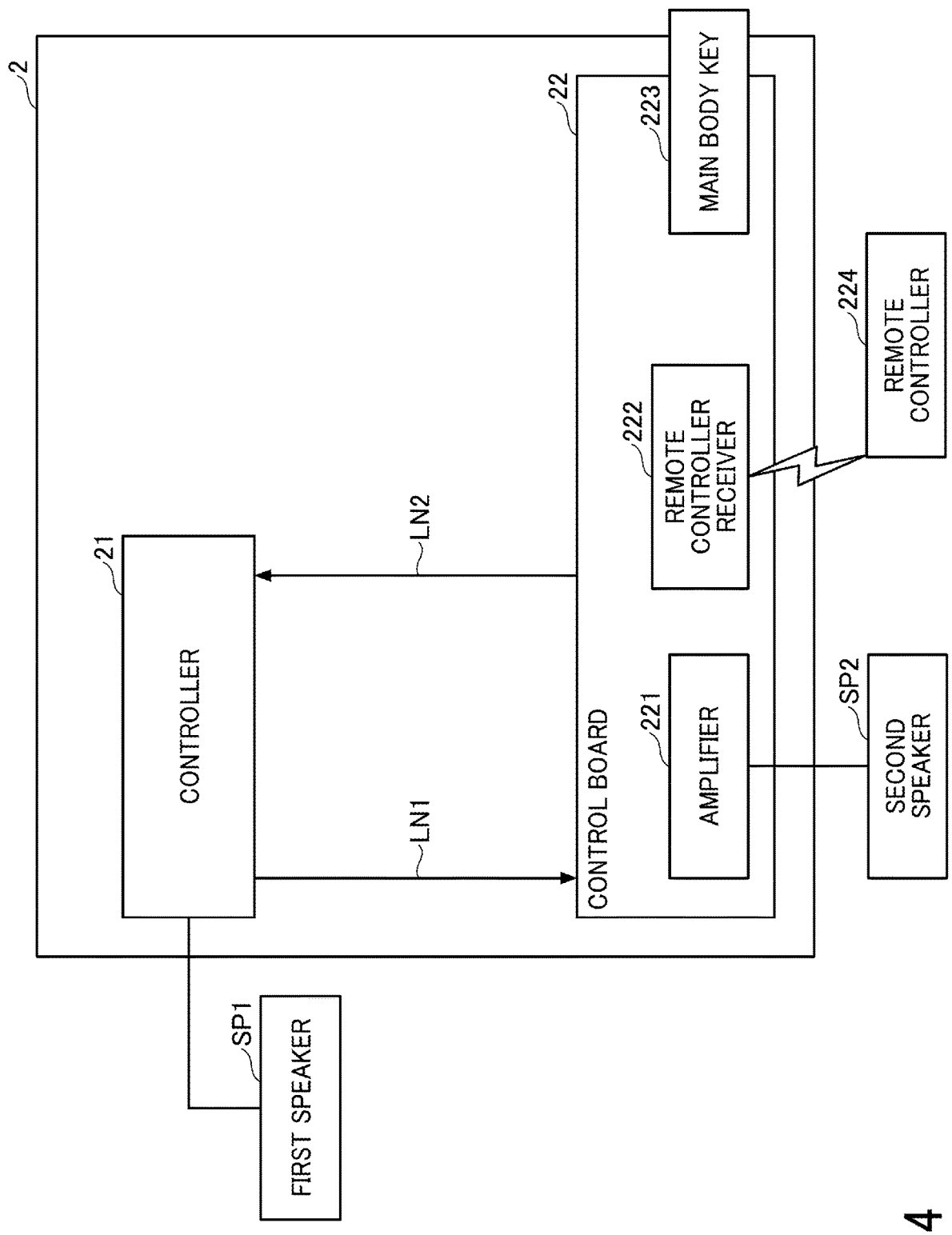
FIG. 4 is a diagram illustrating a first example connection configuration of audio devices, connected to the electronic whiteboard.

First Example Connection Configuration:

FIG. 4 is a diagram illustrating a first example connection configuration of the audio devices. In this connection configuration, the controller 21 and the control board 22 are connected by two control lines, that is, a first control line LN1 and a second control line LN2.

The controller 21 transmits data used for control, to the control board 22, through the first control line LN1. As illustrated in FIG. 4, data, such as control data, flows from the controller 21 to the control board 22 in one direction through the first control line LN1.

The controller 21 and the control board 22 are connected via a USB device to form the second control line LN2. The control board 22 receives operation input to the remote controller 224 at the remote controller receiver 222, and transmits the operation that is received to the controller 21 through the second control line LN2. Alternatively, the user operation may be received at the main body key 223.

Examples of operation input to the remote controller 224 or the main body key 223 include operations for increasing volume, decreasing volume, and turning ON or Off mute.

Further, the second control line LN2 is in compliance with, for example, a USB Human Interface Device (HID) class.

The controller 21 is provided with an Operating System (OS). That is, software for constructing the OS is previously installed in the controller 21. With the OS, the controller 21 is able to transmit the sound output data 303 and the first volume value SD1 to the control board 22 via the first control line LN1. That is, the OS can control the second speaker SP2 to output the sound based on the sound output data 303 via the first control line LN1. The volume value of the sound to be output is controlled according to the first volume value SD1.

When the control board 22 receives the operation for changing the volume value, the control board 22 transmits an instruction (example of an operation result) according to the received operation to the controller 21 via the second control line LN2. Accordingly, the controller 21 controls the first volume value SD1 to have a value according to the operation received by the control board 22.

Further, the control board 22 sets the second volume value SD2 to a fixed value. The volume value of the second speaker SP2 is controlled according to the first volume value SD1. The first volume value SD1 is changed by operation for changing the volume value. With such a configuration, in response to reception of operation for changing the volume value from the remote controller 224, the volume value of sound may be changed for either of sound that is output to the first speaker SP1 or sound that is output to the second speaker SP2.

The OS may be installed on the control board 22. That is, not only the first control unit but also the second control unit may have an OS.

Further, types of OSs may be different between the first control unit and the second control unit. For example, the first control unit may have the WINDOWS-based OS, and the second control unit may have the ANDROID-based OS.

Figure 5:
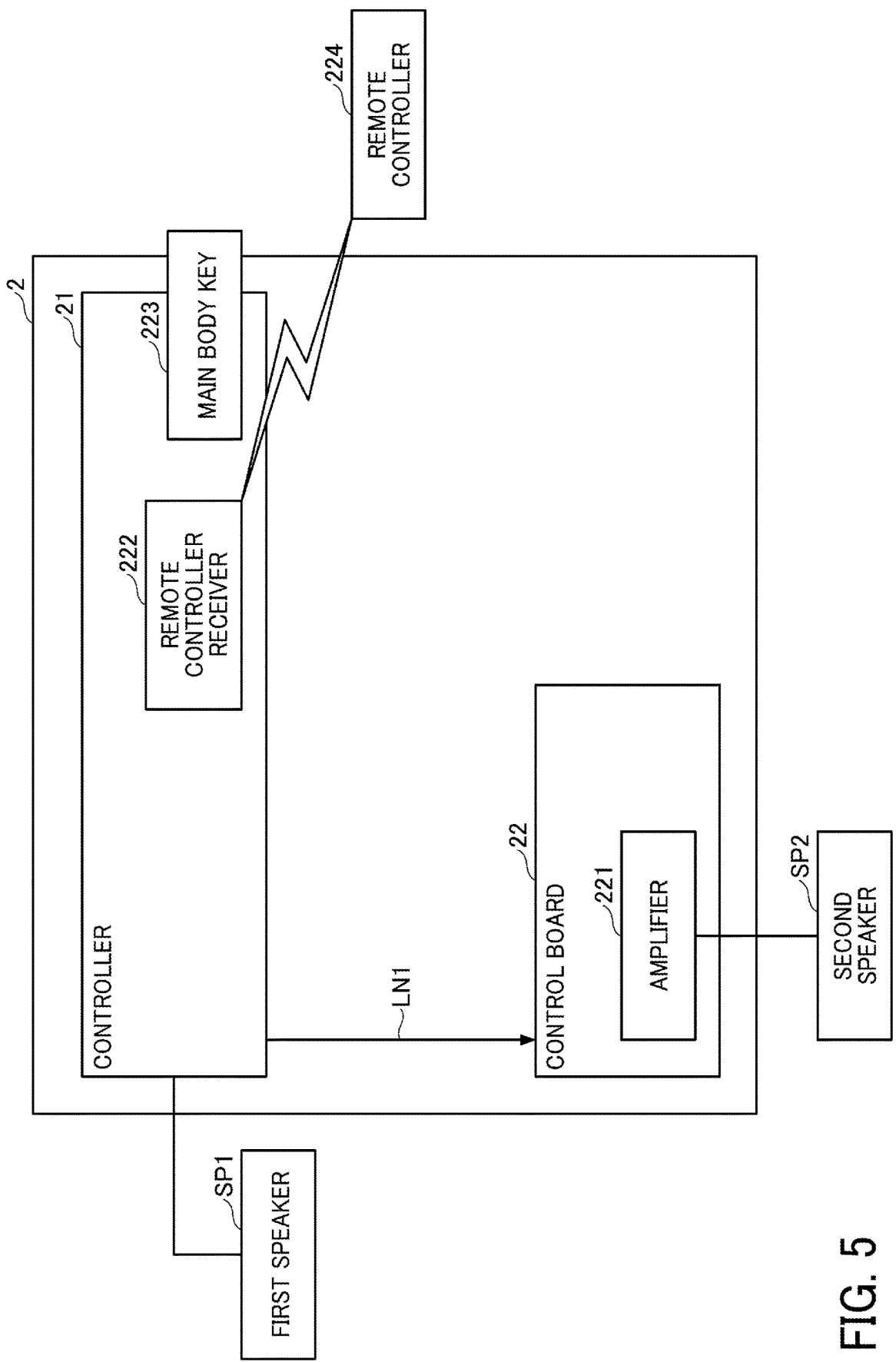
FIG. 5 is a diagram illustrating a second example connection configuration of audio devices, connected to the electronic whiteboard.

Second Example Connection Configuration:

FIG. 5 is a diagram illustrating a second example connection configuration of the audio devices. Compared with the first example connection configuration, the second example connection configuration differs in that the remote control receiver 222 and the main body key 223 are provided in the controller 21. Similarly to the first example connection configuration, the controller 21 is provided with OS. Therefore, even in the second example connection configuration, in response to operation for changing the volume value by the remote controller 224, the controller 21 changes the first volume value SD1 according to the operation that is received. On the other hand, the second volume value SD2 is controlled to be a fixed value.

Accordingly, any of the first speaker SP1 and the second speaker SP2 outputs sound based on the first volume value SD1. With such a connection configuration, in response to reception of operation for changing the volume value from such as the remote controller 224, the volume value of sound may be changed for either of sound that is output to the first speaker SP1 or sound that is output to the second speaker SP2.

As in the first example connection configuration, the control board 22 may include the remote controller receiver 222 and the main body key 223. That is, the operation from the user is to be transmitted to the controller 21 no matter where the operation is received.

Example Operation:

In any of the first example connection configuration and the second example connection configuration, the volume value of sound to be output from the sound output device 20 is changed in response to operation for changing the volume value (hereinafter referred to as "volume control operation SC").

Figure 6:
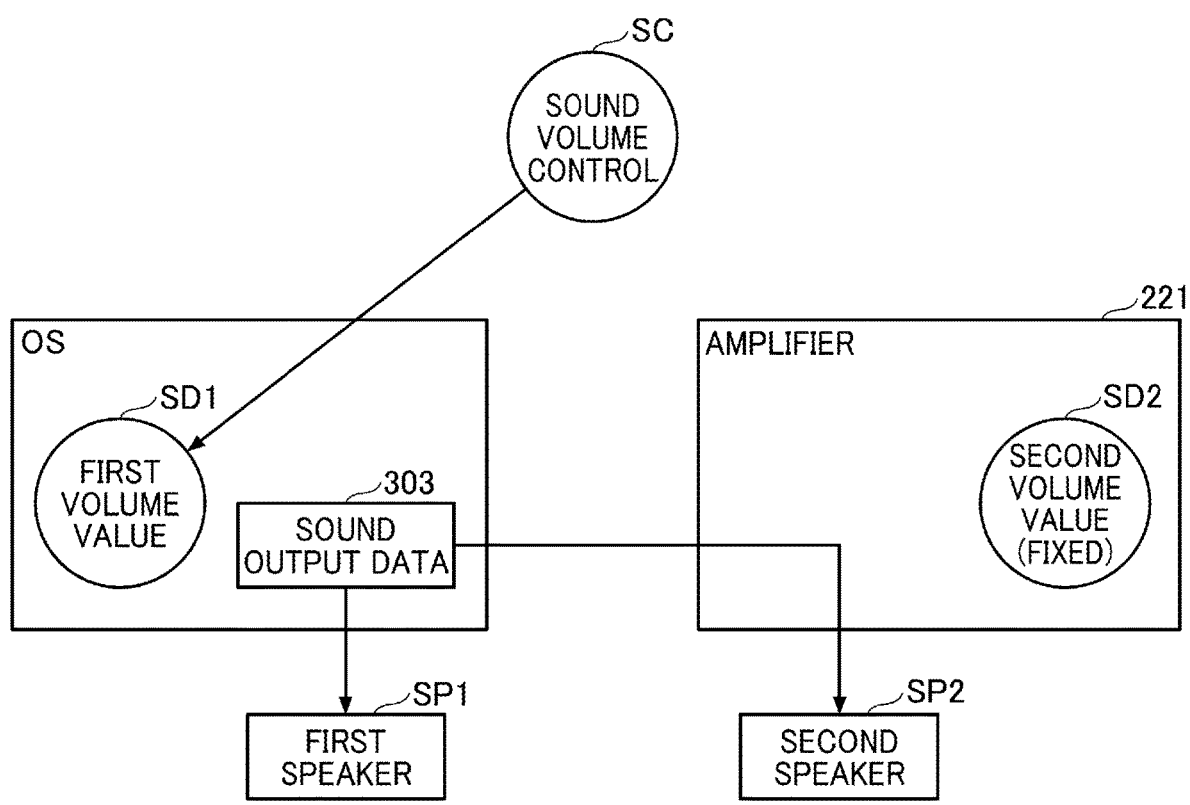
FIG. 6 is a diagram illustrating example operation for controlling sound output.

FIG. 6 is a diagram illustrating example operation. As illustrated in FIG. 6, in response to the volume control operation SC by such as the remote controller 224, the OS on the controller 21 changes the first volume value SD1 stored in the memory. In this way, control is performed so that sound is output from either the first speaker SP1 or the second speaker SP2 based on the first volume value SD1 according to the volume control operation Sc.

On the other hand, the second volume value SD2 is controlled to be a fixed value. That is, the volume value of sound to be output is changed according to the first volume value SD1 for both the first speaker SP1 and the second speaker SP2.

Further, in this configuration, a source of sound output by any one of the first speaker SP1 and the second speaker SP2 is the sound output data 303. That is, the sound output data 303 and the first volume value SD1 are used as sound source, and the content and volume to be output as sound are determined based on the sound source.

The external speaker and the USB speaker may be equipped with an amplifier. When the first volume value SD1 is changed, the volume value of the USB speaker is changed in synchronization with the change of the first volume value SD1. Similarly, the volume value of the external speaker can be changed when the first volume value SD1 which is a sound source is changed. Therefore, sound output from both the first speaker SP1 and the second speaker SP2 can be controlled according to the volume control operation SC.

Figure 7:
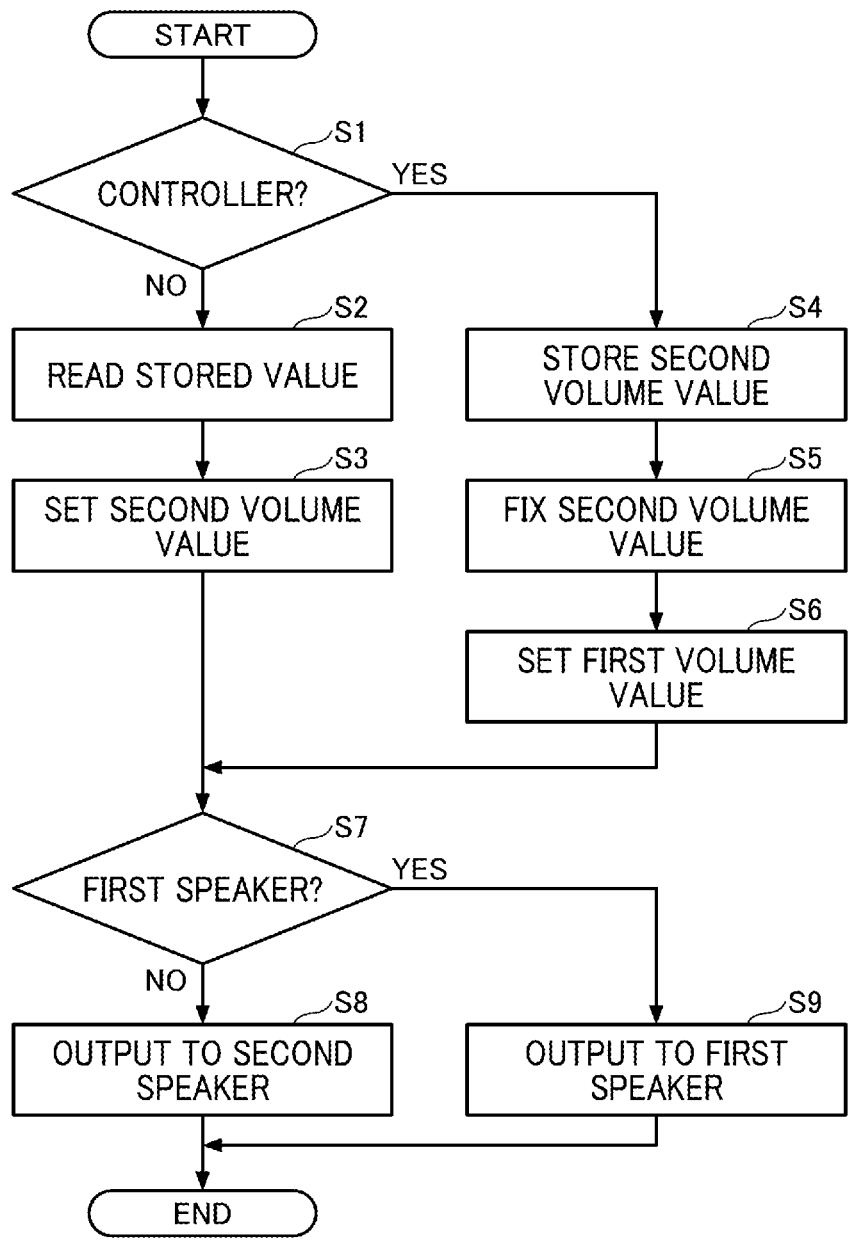
FIG. 7 is a flowchart illustrating operation performed by the electronic whiteboard according to an embodiment.

Example Processing:

FIG. 7 is a flowchart illustrating example processing for sound control, performed by the sound output device 20, according to an embodiment. For example, the operation of FIG. 7 is executed in response to operation by the remote controller 224 or the main body key 223.

(Example of Determining Whether or not a Controller is Provided)

At S1, the second control unit 302 determines whether there is a controller 21. Preferably, the controller 21 is made removable from the electronic whiteboard 2. Alternatively, the controller 21 may be made enabled or disabled, even when the controller 21 is kept connected to or incorporated in the electronic whiteboard 2. Hereinafter, a case where the controller 21 is removable is described as an example. The controller 21 is compliant with, for example, Open Pluggable Specification (OPS). In this disclosure, a control module and slot dedicated to digital signage is used. As long as the controller 21 has a CPU, a memory as a storage area, and various interfaces, the controller 21 may have a configuration other than the configuration described referring to FIG. 2.

The second control unit 302 determines whether or not the electronic whiteboard 2 is provided with the controller 21. That is, in a configuration in which the controller 21 is removable, the controller 21 may be removed from the electronic whiteboard 2. Specifically, in this example, the second control unit 302 determines whether the controller 21 is connected (YES at S1) or disconnected (NO at S1). The second control unit 302 may determine whether or not the controller 21 is removed, by checking the presence or absence of a signal transmitted to or received from the controller 21. Alternatively, the second control unit 302 may determine whether or not the controller 21 is removed, based on a physical switch that detects attachment or detachment of the controller 21 to output on or off.

Next, when it is determined that the controller 21 is present (YES at S1), the second control unit 302 proceeds operation to S4. On the other hand, when it is determined that the controller 21 is not present (NO at S1), the second control unit 302 proceeds operation to S2.

(Example of Reading a Stored Value)

At S2, the second control unit 302 reads a value previously stored (stored value), from such as a memory mounted on the control board 22. For example, the stored value is a value that is previously updated and set as the second volume value SD2 (for example, at S3), or a value that is stored at S4 previously performed when the controller 21 is connected.

(Example of Setting the Second Volume Value)

At S3, the second control unit 302 sets the second volume value SD2, which may be updated.

(Example of Storing Volume Value)

At S4, the first control unit 301 stores a volume value, as the stored value. Here, the first control unit 301 stores a current second volume value SD2 as the stored value in the memory of the control board 22. S4 is performed when the controller 21 is present. Then, at the subsequent S5 and thereafter, the second volume value SD2 is controlled to be a fixed value. It is thus desirable that the second volume value SD2, which is currently used, is stored as the stored value.

Since the volume value is stored, even if the controller 21 is removed, the volume value that is previously used can be obtained, for example, at S2 and set at S3. This can prevent a phenomenon in which the initial value becomes unstable and the volume value suddenly increases or decreases, as the controller 21 is removed or attached.

(Example of Fixing the Second Volume Value)

At S5, the second control unit 302 sets the second volume value to a fixed value. The second volume value SD2, which is now a fixed value, is kept constant even if operation for changing the volume is performed.

For example, it is desirable that the second volume value SD2 is fixed at a maximum value (that is, setting that can output the loudest sound), from among values that can be set.

The second volume value SD2 affects how much the sound is amplified by an amplification unit such as an amplifier, that is, a total volume of the output sound. Therefore, the maximum value for the total volume is determined by the second volume value SD2. If the second volume value SD2 is fixed to a small value, the total volume may not be set at a large value.

On the other hand, when the second volume value SD2 is fixed to a maximum value, the total volume may be set to a large value. Further, when the total volume has a large value, as long as the first volume value SD1 is changed according to operation, the total volume value can be made smaller regardless of the second volume value SD2. Therefore, it is desirable that the second volume value SD2 is fixed at the maximum value.

(Example of Setting the First Volume Value)

At S6, the first control unit 301 sets the first volume value SD1, which indicates volume of sound to be output from the audio device. The first volume value SD 1 may be stored in the memory, such as in the memory of the controller 21.

Here, the first volume value SD1 may be changed according to the user operation. In response to operation for changing the volume value, the first control unit 301 changes the first volume value SD1 according to the received operation. When the first volume value SD1 is changed while the second volume value SD2 is kept fixed, the total volume value is changed.

Specifically, in the first example connection configuration, the controller 21 receives the instruction for changing the volume value from the control board through the second control line LN2. According to the instruction, the controller 21 changes the first volume value SD1.

In the second example connection configuration, the controller 21 receives the operation for changing the volume value at the remote controller receiver 222 or the main body key 223. According to the operation, the controller 21 changes the first volume value SD1.

(Example of Determining Whether or not there is a First Speaker)

At S7, the first control unit 301 determines whether or not the first speaker SP1 is connected.

Next, when it is determined that the first speaker SP1 is connected (YES at S7), the first control unit 301 proceeds operation to S9. On the other hand, when it is determined that the first speaker SP1 is not connected (NO at S7), the first control unit 301 proceeds operation to S8.

(Example of Output by the Second Speaker)

At S8, the second control unit 302 outputs sound from the second speaker SP2, according to the volume set at S3 or S6.

For example, when the controller 21 is provided (YES at S1), the second control unit 302, i.e., the control board 22, receives the sound output data 303 and the first volume value SD1, from the first control unit 301 from the first control line LN1. The second control unit 302 outputs sound based on the sound output data 303 according to the first volume value SD1, through the second speaker SP2.

When the controller 21 is not provided (NO at S1), the second control unit 302 refers to the second volume value SD2, set at S3, to output sound based on sound output data according to the second volume value SD2.

(Example of Output by the First Speaker)

At S9, the first control unit 301 outputs sound from the first speaker SP1, according to the volume set at S6. That is, the first control unit 301 outputs sound based on the sound output data 303 according to the first volume value SD1 through the first speaker SP1. Alternatively, the built-in speaker may output sound.

Even when the controller 21 is connected, the controller 21 can be made enabled or disabled. In such case, as illustrated in the flowchart of FIG. 7, at S1, the second control unit 302 determines whether the controller 21 is enabled (YES at S1) or disabled (NO at S1). When it is determined that the controller 21 is enabled (YES at S1), the second control unit 302 proceeds operation to S4. On the other hand, when it is determined that the controller 21 is disabled (NO at S1), the second control unit 302 proceeds operation to S2.

At S1, for example, the second control unit 302 determines that the controller 21 is enabled when the controller 21 is turned on, and determines that the controller 21 is disabled when the controller 21 is turned off.

Through performing the above-described processing, the volume value of sound output by an external audio device such as a speaker can be controlled, even when there are more than one audio devices. The above-described processing is applicable no matter whether the controller 21 is removable, or made enabled or disabled.

Comparative Example

Figure 8:
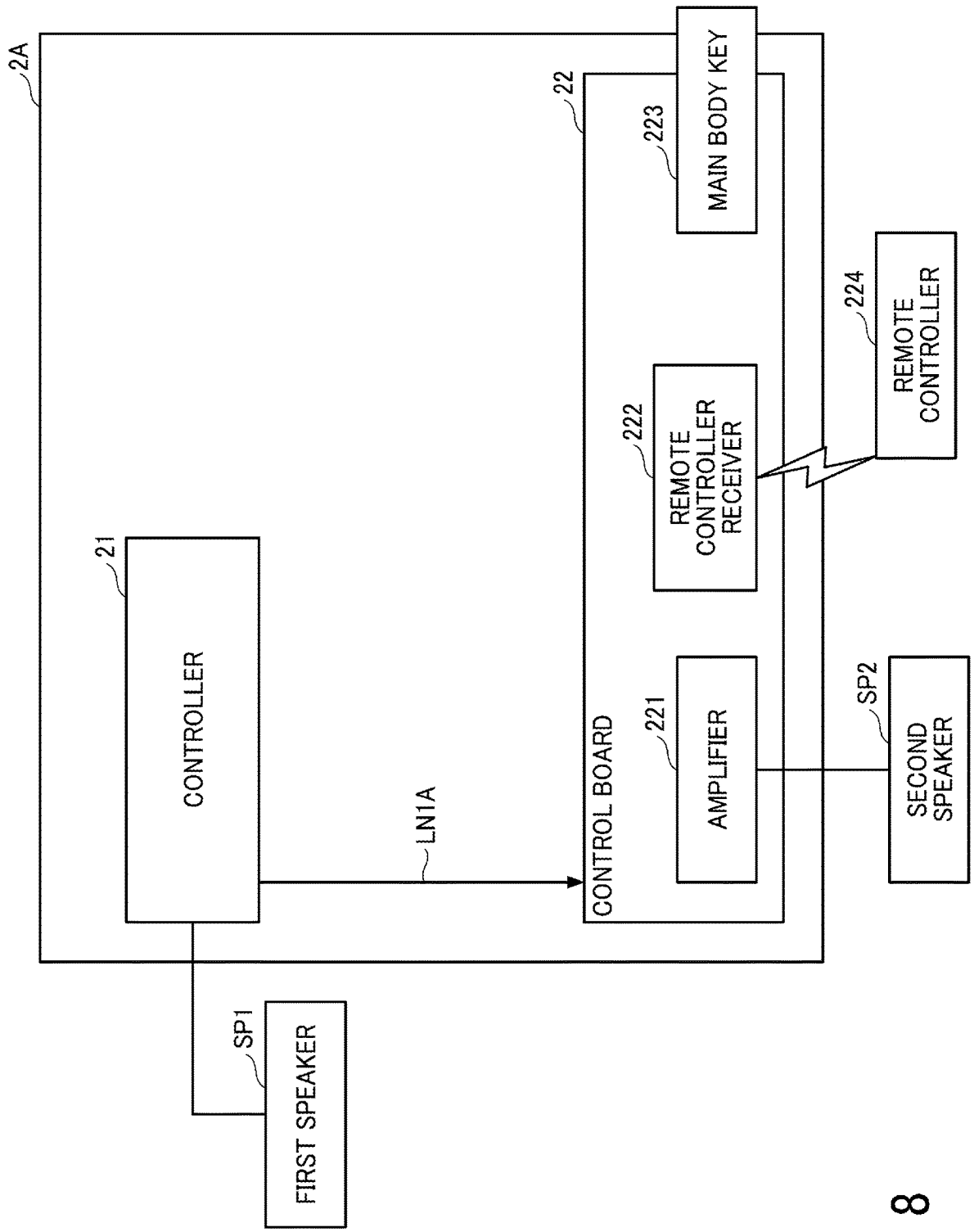
FIG. 8 is a diagram illustrating a comparative example.

FIG. 8 is a diagram illustrating a comparative example. The comparative example is different from the first example connection configuration, in that no second control line LN2 is provided. In FIG. 8, since the controller 21 and the control board 22 are similar in at least hardware structure to the controller 21 and the control board 22, description thereof will be omitted.

In the comparative example, since there is no second control line LN2, operation by the remote controller 224 or the main body key 223 cannot be sent to the controller 21 from the control board 22. Therefore, when such operation is performed, the following result is obtained.

Figure 9:
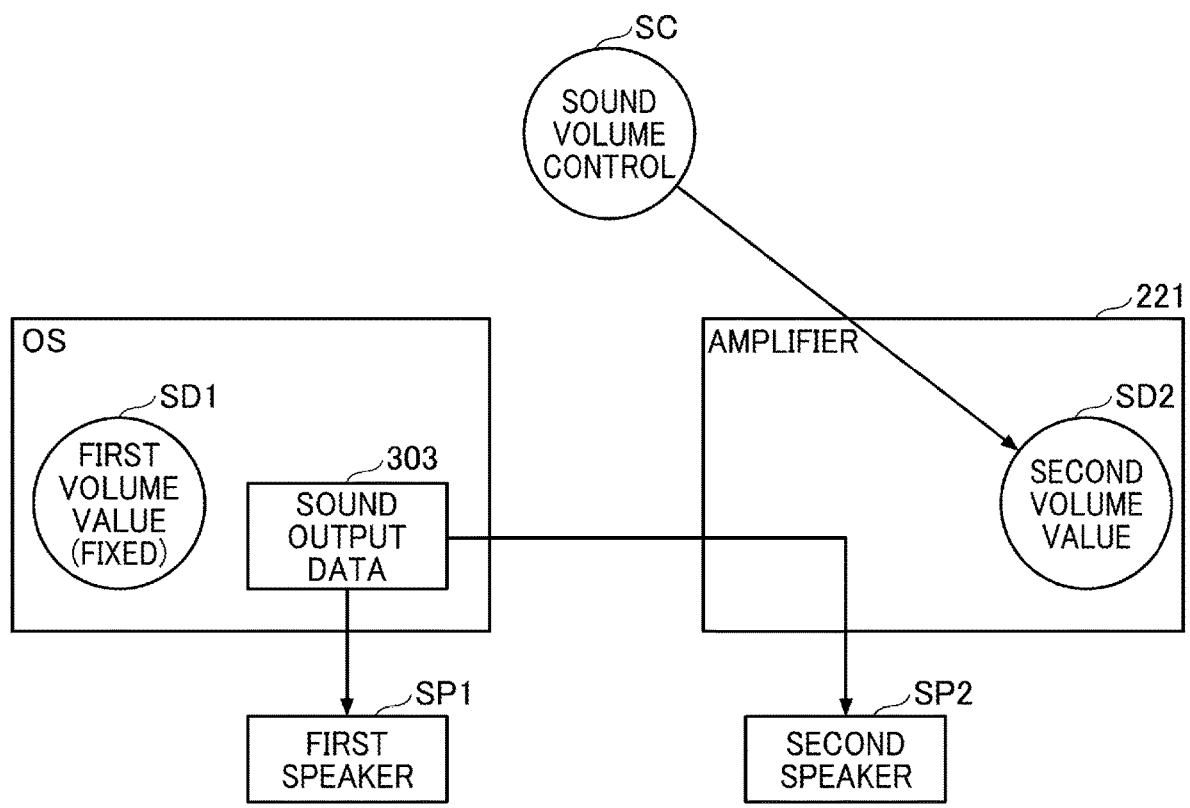
FIG. 9 is a diagram illustrating example operation according to the comparative example.

FIG. 9 is a diagram illustrating an example operation in this comparative example. Comparing with the first example connection configuration and the second example connection configuration, the comparative example is different in that the second volume value SD2 is changed according to the volume control operation SC. Since the second volume value SD2 is for the amplifier 221, the second volume value SD2 does not affect the output of the first speaker SP1. That is, in the configuration of the comparative example, the volume value of the first speaker SP1 is not to be changed according to operation on the control board 22 and the amplifier 221. Further, the first volume value SD1 cannot be changed according to the volume control operation SC without such as the second control line LN2. Under such a configuration, inconsistency occurs unless processing such as synchronizing the first volume value SD1 and the second volume value SD2 is performed.

Therefore, in the comparative example, when an external speaker such as the first speaker SP1 is used, the sound output by the external speaker may not be controlled.

Other Embodiments

Any speaker other than those illustrated in the above example may be used.

The sound output device may be applied to an apparatus other than the electronic whiteboard. For example, the sound output device may be applied to an apparatus that outputs sound, such as a video conference system, a teleconference system, and any device that outputs music. Further, the sound output device may be applied to a television or projector used in a conference room or the like, or a television or projector used at home.

Further, any one of devices in the sound output device, or the electronic whiteboard, does not have to be a single hardware device. That is, any device may be a combination of a plurality of devices. Further, the sound output device may include one or more devices other than those illustrated in FIG. 2.

In this disclosure, all or part of processing illustrated in FIG. 7 may be written in a computer-readable language and performed by a computer, such as the CPU, according to a program that is stored in any memory. That is, the program is a computer program for causing a computer, such as a CPU, which may be incorporated in any one of the sound output device, electronic whiteboard, and a sound output system, to execute a method for controlling sound to output.

Therefore, in execution of the program for controlling sound output, the computer having functions of calculating and controlling, performs calculations and control according to the program to carry out a method for controlling sound output. Further, a storage device, such as a memory, provided for the computer stores various data used for processing according to the program.

The above-described program can be recorded on a computer-readable recording medium for distribution. Examples of the recording medium include a magnetic tape, a flash memory, an optical disc, a magneto-optical disk, and a magnetic disk. The program can be distributed over any desired network such as a telecommunication line.

One or more embodiments of this disclosure may be implemented by a sound output system having a plurality of information processing devices. In addition, the sound output system may execute each process and data storage in a manner that may be redundant, distributed, virtualized, or a combination thereof.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), a digital signal processor (DSP), a field programmable gate array (FPGA), and conventional circuit components arranged to perform the recited functions. Specifically, in this disclosure, the controller functioning as the first control unit may be referred to as first circuitry, and the control board functioning as the second control unit may be referred to as second circuitry.

The invention claimed is:

1. A sound output device comprising:
   first circuitry, connected to a first audio device, configured to output sound based on sound output data via the first audio device according to first sound volume data;
   second circuitry connected to a second audio device, the second circuitry including an amplifier that amplifies sound to be output from the second audio device:
   a control line that allows one-way communication from the first circuitry to the second circuitry; and
   a user interface configured to receive a user input of operation for changing the first sound volume data,
   wherein the sound output data and the first sound volume data are transmitted from the first circuitry to the second circuitry through the control line, and
   wherein the first circuitry is further configured to
      change the first sound volume data according to the user input of operation that is received, and
      transmit the first sound volume ta having been Changed to the second circuitry,
   wherein the second circuitry is configured to
      receive, from the first circuitry, the sound output data and the first sound volume data,
      output sound based on the sound output data that is received, via the second audio device, according to the first sound volume data that is received,
      control a value of second sound volume data set for the amplifier to be a fixed value,
      receive the user input of operation for changing the first sound volume data from the user interface, and
      transmit the operation for changing the first sound volume data to the first circuitry, through another control line that allows communication from the second circuitry to the first circuitry.

2. The sound output device of claim 1, wherein the first circuitry can be removed from or attached to the sound output device, or controlled to be enabled or disabled, and the second circuitry controls the value of the second sound volume data to be a previously stored value, when the first circuitry is removed or controlled to be disabled.

3. A sound output system comprising:
the sound output device of claim 1,
wherein the sound output device is an electronic whiteboard.

4. A sound output system comprising:
the sound output device of claim 1;
a plurality of audio devices including the first audio device and the second audio device.

5. A method for controlling sound output, performed by a sound output device including first circuitry connected to a first audio device and second circuitry connected to a second audio device, the second circuitry including an amplifier that amplifies sound to the output from the second audio device, the method comprising:
determining whether the first circuitry is enabled;
transmitting, based on a determination that the first circuitry is enabled, from the first circuitry to the second circuitry, first sound volume data stored for the first circuitry, and sound output data, through a control line that allows one-wav communication from the first circuitry to the second circuitry;
outputting sound based on the sound output data, via the second audio device, according to the first sound volume data;
controlling a value of second sound volume data set for the amplifier to be a fixed value;
receiving, at the second circuitry, a user input of operation for changing the first sound volume data from a user interface;
transmitting the operation for changing the first sound volume data to the first circuitry, through another control line that allows communication from the second circuitry to the first circuitry;
changing, at the first circuitry, the first sound volume data according to the user input of operation that is received; and
transmitting, from the first circuitry to the second circuitry, the first sound volume data having been changed.

6. A non-transitory recording medium storing a plurality of instructions which, when executed by one or more processors, cause the processors to perform a method for controlling sound output, performed by a sound output device including first circuitry connected to a first audio device and second circuitry connected to a second audio device, the second circuitry including an amplifier that amplifies sound to be output from the second audio device, the method comprising:
determining whether the first circuitry is enabled;
transmitting, based on a determination that the first circuitry is enabled, from the first circuitry to the second circuitry, first sound volume data stored for the first circuitry, and sound output data, through a control line that allows one-way communication from the first circuitry to the second circuitry;
outputting, sound based on the sound output data, via the second audio device, according to the first sound volume data;
controlling a value of second sound volume data set for the amplifier to be a fixed value;
receiving, at the second circuitry, a user input of operation for changing the first sound volume data from a user interface;
transmitting the operation for Changing the first sound volume data to the first circuitry, through another control line that allows communication from the second circuitry to the first circuitry;
changing, at the first circuitry, the first sound volume data according to the user input of operation that is received; and
transmitting, from the first circuitry to the second circuitry, the first sound volume data having been changed.

* * * * *